(12) United States Patent
Kim

(10) Patent No.: US 7,595,977 B2
(45) Date of Patent: Sep. 29, 2009

(54) METHOD FOR JOINING PLATES, PLATE JOINING STRUCTURE, AND DISPLAY MODULE HAVING THE SAME

(75) Inventor: Sok-San Kim, Cheonan-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 561 days.

(21) Appl. No.: 11/226,419

(22) Filed: Sep. 15, 2005

(65) Prior Publication Data

US 2006/0098135 A1 May 11, 2006

(30) Foreign Application Priority Data

Oct. 26, 2004 (KR) .................. 10-2004-0085866

(51) Int. Cl.
*H05K 5/00* (2006.01)
*H05K 7/00* (2006.01)
*B23P 11/00* (2006.01)

(52) U.S. Cl. ............ 361/679.01; 29/243.5; 29/243.522; 29/521

(58) Field of Classification Search ................. 361/681, 361/679.01; 29/33 R, 428–431, 402.03–402.09, 29/213.1–221.6, 403.3–403.4, 728, 765, 29/24.5, 225–232, 234, 237–241, 243–250, 29/252–269, 282, 433, 454–455.1, 460, 724–725, 29/521

See application file for complete search history.

(56) References Cited

U.S. PATENT DOCUMENTS

| | | | | |
|---|---|---|---|---|
| 4,760,634 | A * | 8/1988 | Rapp | 29/509 |
| 5,432,989 | A * | 7/1995 | Turek | 29/243.5 |
| 5,519,934 | A * | 5/1996 | Dobrikow | 29/521 |
| 6,732,420 | B2 * | 5/2004 | Wang et al. | 29/525.06 |
| 7,014,174 | B2 * | 3/2006 | Roberts et al. | 261/29 |
| 7,313,861 | B2 * | 1/2008 | Schneider et al. | 29/798 |
| 7,369,400 | B2 * | 5/2008 | Bang et al. | 361/681 |
| 2002/0063518 | A1 * | 5/2002 | Okamoto et al. | 313/506 |
| 2004/0195969 | A1 * | 10/2004 | Kim et al. | 313/583 |
| 2004/0216290 | A1 * | 11/2004 | Schneider et al. | 29/243.5 |
| 2005/0047067 | A1 * | 3/2005 | Bang et al. | 361/681 |
| 2005/0088092 | A1 * | 4/2005 | Kim et al. | 313/582 |
| 2005/0093429 | A1 * | 5/2005 | Ahn et al. | 313/498 |
| 2006/0192927 | A1 * | 8/2006 | Ikeuchi et al. | 353/119 |

FOREIGN PATENT DOCUMENTS

JP 08-281353 10/1996

(Continued)

*Primary Examiner*—Jayprakash N Ghandi
*Assistant Examiner*—Anthony M Haughton
(74) *Attorney, Agent, or Firm*—H.C. Park & Associates, PLC

(57) ABSTRACT

At least a portion of a first plate and at least a portion of a second plate are arranged to have an overlapping portion, a first deformation unit is formed at the overlapped portion, and a second deformation unit is formed in the first deformation unit. The first deformation unit and the second deformation unit protrude in opposite directions from each other, and the second deformation unit has a smaller cross-sectional width than the first deformation unit. Such a joining structure may be utilized to couple elements together in a display device, such as a plasma display device.

17 Claims, 4 Drawing Sheets

FOREIGN PATENT DOCUMENTS

| | | |
|---|---|---|
| JP | 10193005 | 7/1998 |
| JP | 10-305335 | 11/1998 |
| JP | 2002006755 | 1/2002 |
| KR | 10-2004-0024403 | 3/2004 |
| KR | 1020040024403 | 3/2004 |

* cited by examiner

METHOD FOR JOINING PLATES, PLATE JOINING STRUCTURE, AND DISPLAY MODULE HAVING THE SAME

CROSS REFERENCE TO RELATED APPLICATION

This application claims priority to and the benefit of Korean Patent Application No. 10-2004-0085866, filed on Oct. 26, 2004, which is hereby incorporated by reference for all purposes as if fully set forth herein.

BACKGROUND OF THE INVENTION

1. Field of the Invention

The present invention relates to a method for joining plates and a plate joining structure, and more particularly, to a method for joining plates using plastic deformation of plates and a plate joining structure.

2. Discussion of the Background

FIG. 1 is a perspective view of a display module that may be employed in a plasma display device.

Referring to FIG. 1, the display module includes a display panel 50, a plurality of driving circuit boards 40 having circuits for driving the display panel 50, and a chassis 10 that supports the display panel 50 and the driving circuit boards 40.

The display panel 50 includes a front substrate 51 and a rear substrate 52 that are joined together, and it is coupled with the driving circuit boards 40 by connection cables 20.

The chassis 10 supports the display panel 50, which is mounted on the chassis' front surface, and the driving circuit boards 40, which are mounted on the chassis' rear surface. However, the chassis 10 is preferably formed as thin as possible to minimize the plasma display device's overall weight. Therefore, as FIG. 1 shows, a reinforcing member 12 may be coupled with a thin chassis base 11 to reinforce the chassis base 11, thereby assisting with supporting the display panel 50 and the driving circuit boards 40. Not only does the chassis base 11 support the display panel 50 and the driving circuit boards 40, but it also acts as a ground for circuits coupled with the display panel 50 and the driving circuit boards 40. Further, the chassis base 11 dissipates heat generated from the display panel 50 during operation.

The connection cables 20 comprise tape carrier packages (TCP). In the connection cables 20, a plurality of cables extend in a length direction of the connection cable 20, and at least a portion of the connection cables 20 is coupled with an integrated circuit chip 21 that is mounted on the connection cables 20. The integrated circuit chip 21 is fixed on the reinforcing member 12, and a cover plate 60, which protects the connection cables 20 and the integrated circuit chip 21, is coupled with the reinforcing member 12. The cover plate 60 may be coupled with the reinforcing member 12 using fasteners, such as screws 61.

FIG. 2 is a cross-sectional view taken along line II-II of FIG. 1, and FIG. 3A, FIG. 3B, and FIG. 3C are cross-sectional views showing a method of forming the plate joining structure.

Referring to FIG. 2, FIG. 3A, FIG. 3B, and FIG. 3C, the chassis base 11 and the reinforcing member 12 are joined together by plastic deformation at portion where they overlap. That is, after overlapping the chassis base 11 and the reinforcing member 12, plastic deformation is generated, using a tool 93, 94 having a predetermined shape, on an overlapped portion of the two plates by applying a high compression force from both sides of the plates. In the joining structure 80, the joining force is generated from a shaped-joining formed by contacting a protruded portion 84 of the lower plate 92 with a depressed portion 83 of the upper plate 91. That is, the shape of the protruded portion 84 of the lower plate 92 is formed corresponding to the shape of the depressed portion 83 of the upper plate 91, and the protruded portion 84 and the depressed portion 83 interfere with each other's relative motion.

The overall weight of the display panel 50 and the driving circuit boards 40 may vary according to the size of the modules, but, in general, it is about 30-100 kg.

However, in a conventional joined structure, it may be difficult to achieve a desired level of plastic deformation of the chassis base 11 and the reinforcing member 12 due to the thickness of the reinforcing member 12, which requires greater strength than that of the chassis base 11. Accordingly, the joining force of the joined portion may not be strong enough to withstand the weight of the driving circuit boards and the display panel. Consequently, the joined portion may become deformed. Therefore, there is a need to develop an improved plate joining structure and a method for joining plates.

SUMMARY OF THE INVENTION

The present invention provides a plate joining structure and a method for joining plates that may provide an acceptable joining force by plastically deforming the plates to a desired level, even when joining thick plates.

The present invention also provides a display module that may be easily manufactured, that may maintain joining strength, and that may prevent interference among elements by utilizing the plate joining structure according to an embodiment of the invention.

Additional features of the invention will be set forth in the description which follows, and in part will be apparent from the description, or may be learned by practice of the invention.

The present invention discloses a method for joining plates that includes overlapping at least a portion of a first plate and at least a portion of a second plate, forming a first deformation unit at the overlapped portion, and forming a second deformation unit in the first deformation unit. The first deformation unit and the second deformation unit protrude in opposite directions from each other, and the second deformation unit has a smaller cross-sectional width than the first deformation unit.

The present invention also discloses a plate joining structure including a first deformation unit where at least a portion of a first plate and at least a portion of a second plate overlap, and a second deformation unit in the first deformation unit. The first deformation unit and the second deformation unit protrude in opposite directions from each other, and the second deformation unit has a smaller cross-sectional width than the first deformation unit.

The present invention also discloses a display module including a display panel, a driving circuit board including a driving circuit for driving the display panel, a chassis base that supports the display panel and the driving circuit board, and a reinforcing member coupled with the chassis base. The chassis base and the reinforcing member are coupled together by a first deformation unit and a second deformation unit that are formed where at least a portion of the chassis base and at least a portion of the reinforcing member overlap. The first deformation unit and the second deformation unit protrude in opposite directions from each other, and the second deformation unit has a smaller cross-sectional width than the first deformation unit.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 1:
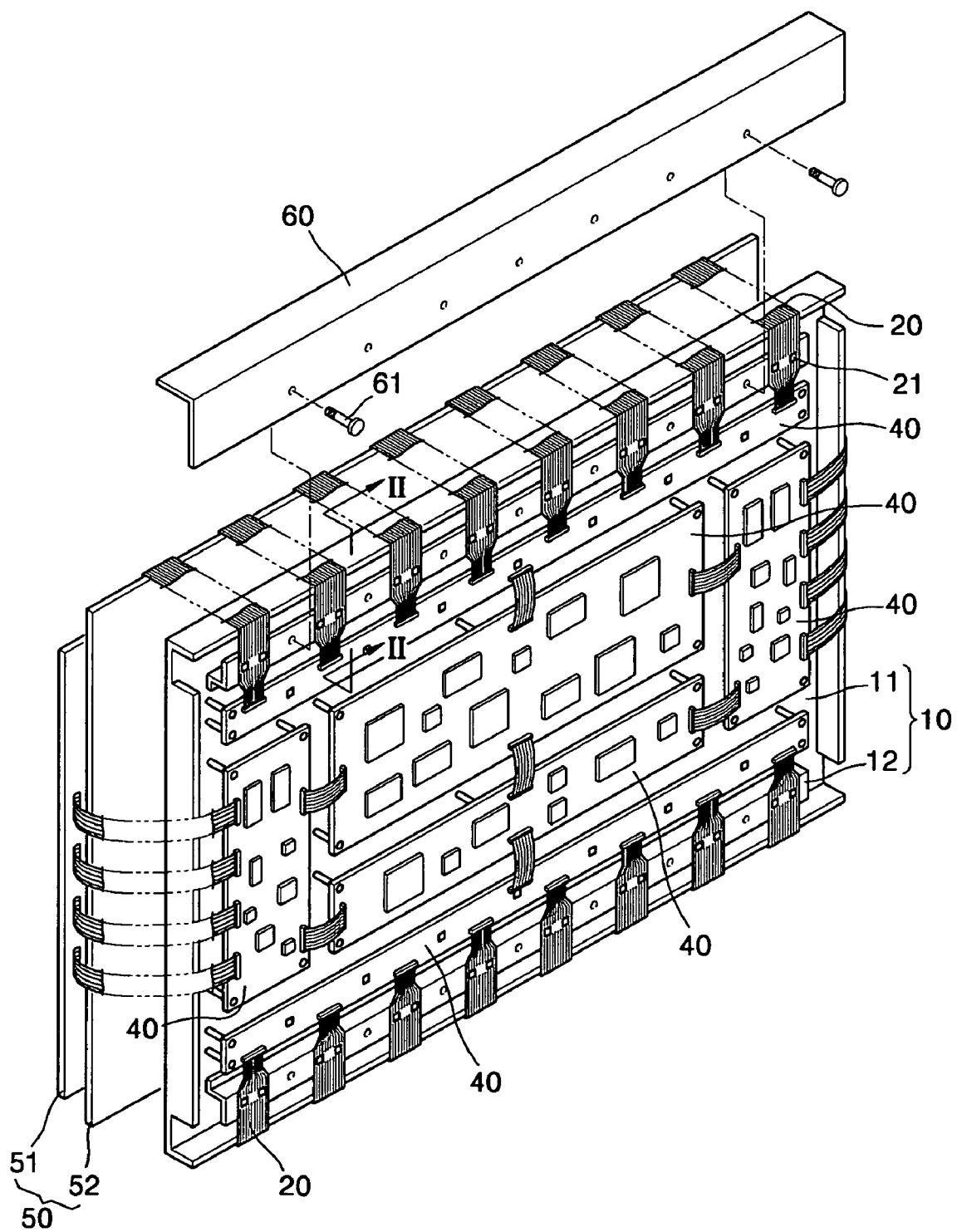
FIG. 1 is a perspective view of a typical display module employed in a plasma display device.

The present invention will now be described more fully with reference to the accompanying drawings in which exemplary embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity.

The term "plate" does not necessarily denote a body that is smooth, flat, relatively thin, rigid, and with uniform thickness. For example, the body may include curved or angled surfaces.

Figure 4:
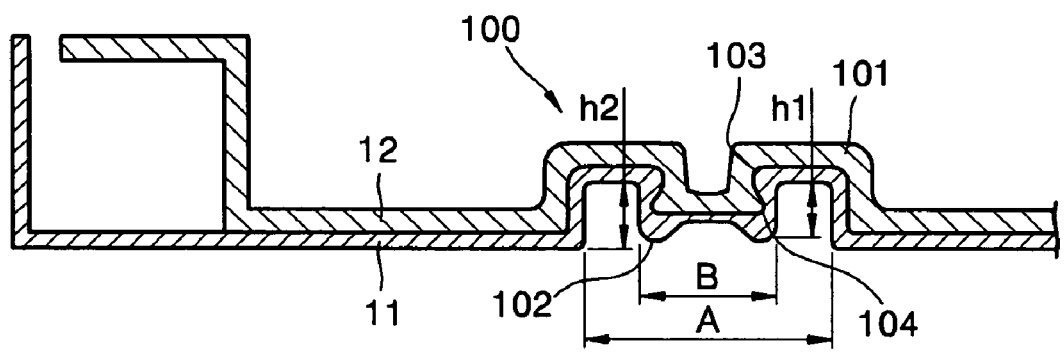
FIG. 4 is a cross-sectional view of a plate joining structure according to an exemplary embodiment of the present invention.

FIG. 4 is a cross-sectional view of a plate joining structure according to an exemplary embodiment of the present invention.

Referring to FIG. 4, a plate joining structure 100 according to an exemplary embodiment of the present invention may include a first deformation unit 101 and a second deformation unit 102.

The first deformation unit 101 is formed by deforming plates at a portion where a predetermined portion of the plates overlap. The first deformation unit 101 may protrude from the plates to have a substantially circular shape having a predetermined cross-sectional width A on the plates.

The second deformation unit 102 may be formed in the first deformation unit 101 to protrude in an opposite direction than that of the first deformation unit 101. The cross-sectional width B of the second deformation unit 102 is smaller than the cross-sectional width A of the first deformation unit 101. In the cross-section of the second deformation unit 102, the boundary portion between a protrusion part 104, which is deformed outward from the center of the first plate placed on a second plate, and a depression part 103, which is deformed inward from the outside of the second plate, generates a joining force in upper and lower directions of the joined plates. That is, the joining force in upper and lower directions is generated by the joining of the protrusion part 104 and the depression part 103.

The depth h2 of the concave portion of the first deformation unit 101 is substantially the same as or greater than the height h1 of the protruded portion of the second deformation unit 102. Therefore, if an additional plate is arranged on a lower surface of the second plate, that is, the chassis base 11, the additional plate will not contact the protruded portion of the second deformation unit 102. That is, the plate joining structure according to the present embodiment allows the lower surface of the chassis base 11 to maintain its substantially planar characteristic.

Exemplary methods for forming the first deformation unit 101 and the second deformation unit 102 will now be described.

At least two plates are arranged so that a predetermined portion of each plate overlaps the other. Next, a tool having a shape corresponding to the appearance of the first deformation unit 101 may be arranged on and under the overlapped portion of the plates, and the first deformation unit 101 is formed by applying a compression force to the plates. The second deformation unit 102 may then be formed by arranging a tool having a shape corresponding to the appearance of the second deformation unit 102 and applying a compression force in upper and lower directions on the location where the first deformation unit 101 is formed. When forming the first deformation unit 101 and the second deformation unit 102, even if the plates to be joined are thick, the protrusion part 104 and the depression part 103 at the second deformation unit 102 may be deformed to a required extent in a side direction. Moreover, the process for forming the second deformation unit 102 may begin before completing the process for forming the first deformation unit 101. This case provides a substantially identical result as the process noted above.

Figure 2:
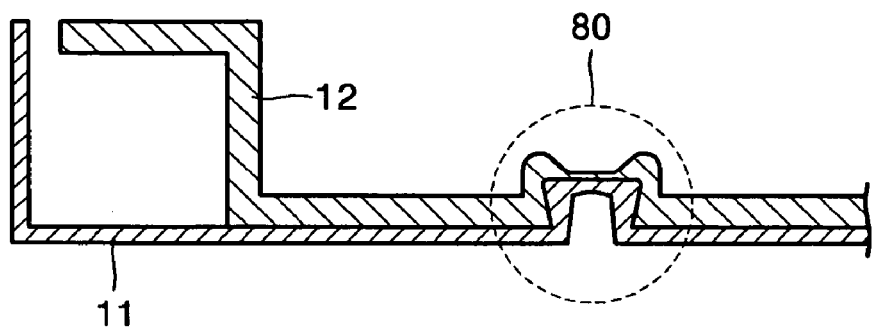
FIG. 2 is a cross-sectional view taken along line II-II of FIG. 1.
Figure 3A:
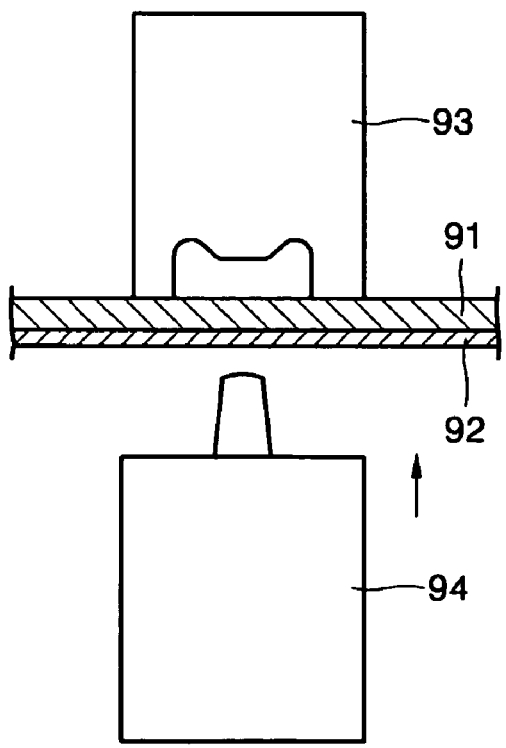
FIG. 3A, FIG. 3B and FIG. 3C are cross-sectional views for explaining a conventional method for joining plates
Figure 3B:
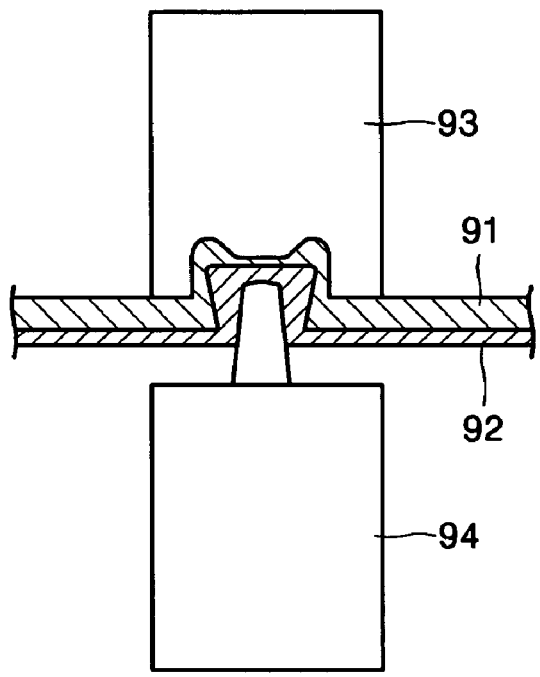
Figure 3C:
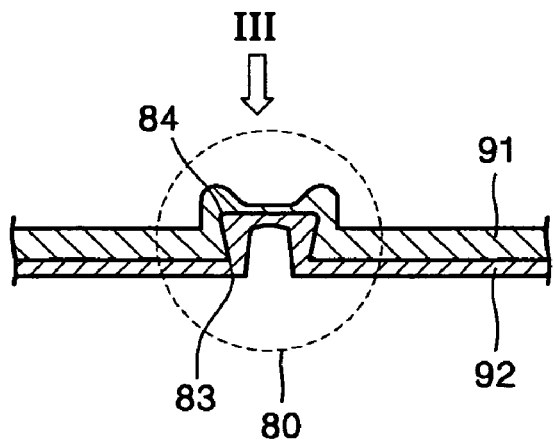

If the method for joining the plates and the plate joining structure according to embodiments of the present invention are utilized to join the chassis base 11 and the reinforcing member 12 in the display module of FIG. 1 and FIG. 2, the joining force may be increased, the manufacturing process may be more convenient, and greater electrical stability may be acquired.

In the case of the display module of FIG. 1, a thin plate is used to reduce the weight of the chassis base 11, and a reinforcing member 12 is used to reinforce the strength of the chassis base 11. Conventionally, the reinforcing member 12 is typically formed thicker than the chassis base 11. In this case, a desired level of a joining force may be obtained when applying the method for joining the plates and the plate joining structure according to embodiments of the present invention.

When joining plates using rivets or screws, through holes are formed in the plates. However, when utilizing the method for joining plates and the plate joining structure according to embodiments of the present invention, forming through holes in plates and attaching fasteners is unnecessary, thereby simplifying the manufacturing process and reducing process time.

Furthermore, when plates are joined by screws through through holes, metal pieces may be produced from the plates. The metal pieces may cause short circuits of the driving circuit boards 40, which are attached on a rear surface of the chassis base 11. Therefore, utilizing the method for joining plates and the plate joining structure according to embodiments of the present invention prevents such short circuits from occurring.

Figure 5:
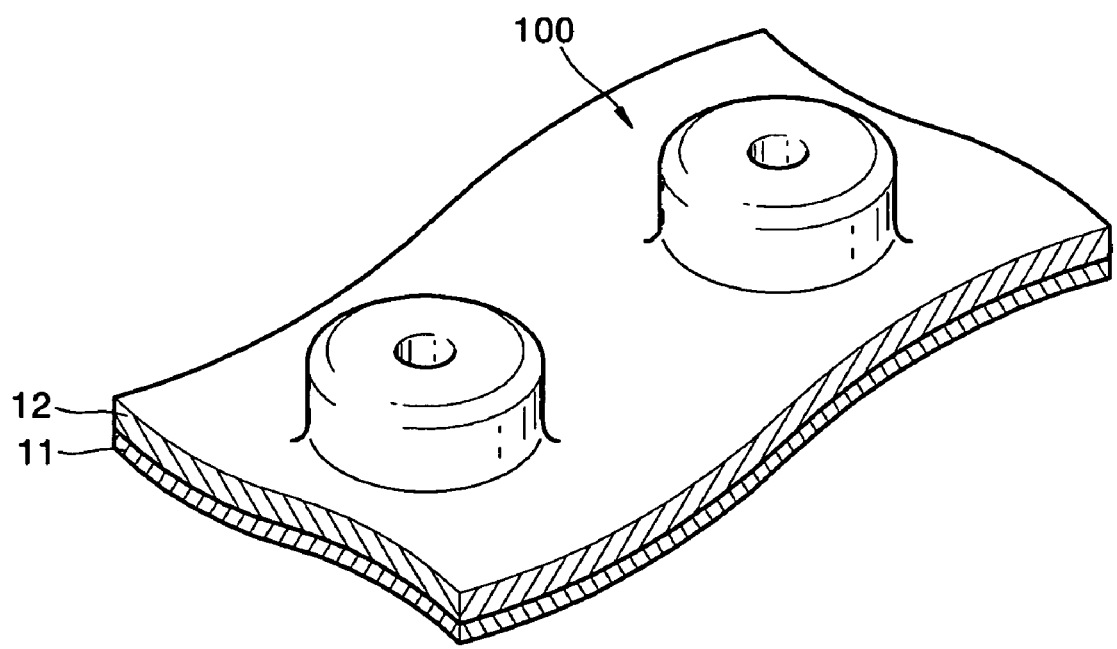
FIG. 5 is a perspective view of a plate joining structure according to an exemplary embodiment of the present invention.

FIG. 5 is a perspective view of a plate joining structure according to an embodiment of the present invention.

Referring to FIG. 5, the plate joining structure 100 according to an embodiment of the present invention includes a first deformation unit and a second deformation unit. A shape protruded upward from the plates represents the first deformation unit, and a depressed portion on a center of the first deformation unit represents the second deformation unit. Both the first deformation unit and the second deformation unit are substantially circular in a top view, and the circles are substantially concentric circles on a plane parallel to the plates.

As described above, according to exemplary embodiments of the present invention, plates may be readily joined to a desired level of joining force by a simple process.

According to exemplary embodiments of the present invention, thick plates may be joined to a desired shape and joining force.

When the method for joining plates and the plate joining structure according to embodiments of the present invention are applied to a display module, the method for manufacturing the display module may be simplified and the joining force of the display module may be significantly improved. Also, electrical stability of the display module may be increased since metal pieces that can cause malfunctions of circuits of the driving circuit boards may be avoided.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for joining plates, comprising:
   overlapping at least a portion of a first plate and at least a portion of a second plate;
   forming a first deformation unit at the overlapped portion; and
   forming a second deformation unit in the first deformation unit,
   wherein the first deformation unit and the second deformation unit protrude in opposite directions from each other, and the second deformation unit has a smaller cross-sectional width than the first deformation unit, and
   wherein the second deformation unit is surrounded by a space in a concave portion of the first deformation unit.

2. The method of claim 1, wherein forming the second deformation unit begins before completing the forming of the first deformation unit.

3. The method of claim 1, wherein the first deformation unit and the second deformation unit consist of the first plate and the second plate.

4. The method of claim 1, wherein the first plate contacts the second plate across the entire first deformation unit and the entire second deformation unit.

5. The method of claim 1, wherein the first deformation unit and the second deformation unit are integrally formed on the first plate and the second plate.

6. The method of claim 1, wherein the first deformation unit comprises a first surface and a second surface and at least one sidewall on the first surface is parallel to at least one sidewall on the second surface.

7. A plate joining structure, comprising:
   a first deformation unit where at least a portion of a first plate and at least a portion of a second plate overlap; and
   a second deformation unit in the first deformation unit,
   wherein the first deformation unit and the second deformation unit protrude in opposite directions from each other, and the second deformation unit has a smaller cross-sectional width than the first deformation unit, and
   wherein the second deformation unit is surrounded by a space in a concave portion of the first deformation unit.

8. The plate joining structure of claim 7, wherein a depth of a concave portion of the first deformation unit is equal to or greater than a height of a protruded portion of the second deformation unit.

9. The plate joining structure of claim 7, wherein the first deformation unit and the second deformation unit have a substantially circular shape in a top view.

10. The plate joining structure of claim 7, wherein the first deformation unit and the second deformation unit consist of the first plate and the second plate.

11. The plate joining structure of claim 7, wherein the first plate contacts the second plate across the entire first deformation unit and the entire second deformation unit.

12. A display module, comprising:
    a display panel;
    a driving circuit board including a driving circuit for driving the display panel;
    a chassis base that supports the display panel and the driving circuit board; and
    a reinforcing member coupled with the chassis base,
    wherein the chassis base and the reinforcing member are coupled together by a first deformation unit and a second deformation unit that are formed where at least a portion of the chassis base and at least a portion of the reinforcing member overlap,
    wherein the first deformation unit and the second deformation unit protrude in opposite directions from each other, and the second deformation unit has a smaller cross-sectional width than the first deformation unit, and
    wherein the second deformation unit is surrounded by a space in a concave portion of the first deformation unit.

13. The display module of claim 12, wherein a depth of a concave portion of the first deformation unit is equal to or greater than a height of a protruded portion of the second deformation unit.

14. The display module of claim 12, wherein the first deformation unit and the second deformation unit have a substantially circular shape in a top view.

15. The display module of claim 12, wherein the display panel is a plasma display panel.

16. The display module of claim 12, wherein the first deformation unit and the second deformation unit consist of the first plate and the second plate.

17. The display module of claim 12, wherein the first plate contacts the second plate across the entire first deformation unit and the entire second deformation unit.

* * * * *

UNITED STATES PATENT AND TRADEMARK OFFICE
CERTIFICATE OF CORRECTION

PATENT NO. : 7,595,977 B2  Page 1 of 1
APPLICATION NO. : 11/226419
DATED : September 29, 2009
INVENTOR(S) : Sok-San Kim It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 927 days.

Signed and Sealed this

Twenty-eighth Day of September, 2010

David J. Kappos
*Director of the United States Patent and Trademark Office*